United States Patent [19]
Nutz

[11] 3,986,143
[45] Oct. 12, 1976

[54] SAWTOOTH GENERATOR HAVING A WIDE FREQUENCY VARIATION RANGE

[75] Inventor: Karl-Dieter Nutz, Heilbronn, Germany

[73] Assignee: Licentia Patent-Verwaltungs-G.m.b.H., Frankfurt am Main, Germany

[22] Filed: Sept. 10, 1975

[21] Appl. No.: 611,973

[30] Foreign Application Priority Data
Sept. 11, 1974 Germany............................ 2443406

[52] U.S. Cl................................. 331/111; 307/228
[51] Int. Cl.²...................... H03K 3/26; H03K 4/08
[58] Field of Search................... 331/111; 307/228; 328/183

[56] References Cited
UNITED STATES PATENTS

| | | | |
|---|---|---|---|
| 3,015,784 | 1/1962 | Cirone | 331/111 |
| 3,144,620 | 8/1964 | Raillard | 331/111 |
| 3,225,310 | 12/1965 | Stratton et al. | 331/111 |
| 3,463,937 | 8/1969 | Taylor | 307/228 |
| 3,803,516 | 4/1974 | Wilcox | 331/111 |

Primary Examiner—Stanley D. Miller, Jr.
Attorney, Agent, or Firm—Spencer & Kaye

[57] ABSTRACT

An improved sawtooth generator of the type in which a capacitor is charged slowly from a constant current source and discharged rapidly via a circuit including first and second mutually complementary transistors with the first transistor having its emitter connected to the capacitor and controlled by the capacitor voltage, its base connected to a first reference voltage and to the collector of the second transistor, and its collector connected to the base of the second transistor, and with the emitter of the second transistor being connected to ground. A wide frequency variation range for the above sawtooth generator is realized by the provision of a complementary auxiliary pair of transistors including a third and a fourth transistor. The third transistor has its base connected to the emitter of the first transistor, its collector connected to the base of the fourth transistor and its emitter connected to a second reference voltage, while the fourth transistor has its collector connected to the collector of the first transistor and its emitter connected to ground.

3 Claims, 2 Drawing Figures

SAWTOOTH GENERATOR HAVING A WIDE FREQUENCY VARIATION RANGE

BACKGROUND OF THE INVENTION

The present invention relates to an improved sawtooth voltage generator having a wide frequency variation range which is particularly useful for phase triggering control purposes.

Sawtooth voltages are generally produced by slowly charging a capacitor with a constant current and then rapidly discharging the capacitor via an electronic switch. The switch is preferably formed by the collector-emitter path of a transistor.

In a known sawtooth generator of this type (e.g. see the book by Tietze and Schenk, "Halbleiter-Schaltungstechnik" [Semiconductor Switching Art], 1971, pages 568–570) the switch is constituted by a pair of transistors which are interconnected to form a simulated thyristor or a unijunction transistor. Such a pair of transistors permits particularly rapid discharging of the capacitor.

In practice, there often exists the desire to vary the frequency of such a sawtooth generator. The frequency is determined by the value of the capacitor as well as by the charging current. However, the charging current in such known circuit can be varied only within relatively narrow limits because it must not fall below the firing current for the transistors nor exceed the holding current for the transistors.

Such a sawtooth generator is shown in FIG. 1 and includes a capacitor 5 having one terminal connected to ground and its other terminal connected to the output of a constant current source. The capacitor 5 is charged with a constant charging current I from the current source 6 so that the voltage $V_S$ at terminal 7 increases in a sawtooth manner in the negative direction. Connected to the capacitor 5 is a pair of complementary transistors 1, 2, which constitutes a simulated thyristor or a unijunction transistor and which serves to suddenly discharge the capacitor 5. The transistor 1 has its emitter connected to one terminal of the capacitor 5, its collector connected to the base of the transistor 2, and its base connected to the collector of the transistor 2 and to a point of reference or threshold voltage $V_1$ provided at the output of a voltage divider formed by a Zener diode 8 and a resistor 9 connected in series between the input terminal for a source of supply voltage $-V_B$ and ground. The emitter of transistor 2 is connected to ground. In the illustrated embodiment of the sawtooth generator, in view of the polarity of the supply voltage $-V_B$ and the current I, the transistor 1 is an NPN transistor and the transistor 2 is an PNP transistor. It is to be understood, however, that if desired the circuit may be operated with a supply voltage of the opposite polarity in which case the polarity type of the transistors 1 and 2 would be reversed.

During the charging process of capacitor 5, the transistors 1 and 2 are normally nonconductive. If the voltage $V_S$ has reached the value $-(V_1 + V_{BE1})$, where $V_{BE1}$ is the base-emitter voltage of transistor 1, transistors 1, 2 become conductive and cause a rapid discharge of capacitor 5. After the sudden discharge of capacitor 5 transistors 1 and 2 become nonconductive and the charging process from current source 6 begins anew.

The charging current I must here exceed a minimum value, i.e., firing current $I_Z$, in order for transistor 2 to be fully switched through, i.e., conductive. However, with very low currents, the current amplification of the transistors 1 and 2 decreases. Moreover, the current amplification factor of transistor 2 is additionally reduced in that a discharge resistor 10 must generally be connected between the base and the emitter of transistor 2 in order to discharge the blocking current of transistor 1. If now the charging current I is not sufficient to produce the necessary voltage drop across resistor 10 to switch through transistor 2, the voltage $V_S$ may get stuck and remain at the value $-(V_1 + V_{BE1})$. The charging current I must thus not be reduced to a value below $I_Z$ during setting of the frequency.

In the switched-through state of the transistors 1 and 2, current additionally flows through transistor 2 via voltage divider resistor 9. The discharge current from capacitor 5 and the charging current I now keep transistor 2 conductive. If, however, capacitor 5 has been discharged to the value $V_{BE1} + V_{CES2}$ (collector-emitter saturation voltage of transistor 2) the charging current I CES2 no longer be sufficient to keep the transistor circuit conductive so that the circuit will be switched as desired. This also produces an upper limit value for the charging current I, i.e., the holding current $I_H$, which when exceeded causes transistors 1, 2 to remain conductive. As soon as the firing voltage has been reached, $V_S$ will collapse to the above-mentioned value and remain stuck there.

SUMMARY OF THE INVENTION

It is therefore the object of the present invention to improve the above-described circuit so that it will be possible to vary the charging current and thus the frequency within wide limits.

This is accomplished according to the invention in that the above-described prior art sawtooth generator, including a capacitor having one terminal connected to ground and its other terminal connected to the output of a constant current source for slowly charging same, and first and second complementary transistors with the first transistor having its emitter connected to the above-mentioned other terminal of the capacitor, its base connected to the collector of the second transistor and to a point of reference potential, and its collector connected to the base of the second transistor whose collector is connected to ground, is additionally provided with third and fourth complementary transistors with the third transistor, which is of the same polarity type as the first transistor, having its base connected to the emitter of the first transistor, its emitter connected to a second point of reference potential and its collector connected to the base of the fourth transistor, and with the fourth transistor having its collector connected to the collector of the first transistor and its emitter connected to ground.

In the solution provided by the present invention the second pair of complementary transistors, which is of approximately the same configuration as the first pair, provides a considerable range of variation for the charging current and thus for the frequency. It has been found that with the circuit of the present invention the charging current can vary in a ratio greater than 1:30,000 which permits a considerable variation range for the frequency.

DETAILED DESCRIPTION OF THE PREFERRED EMBODIMENTS

Figure 1:
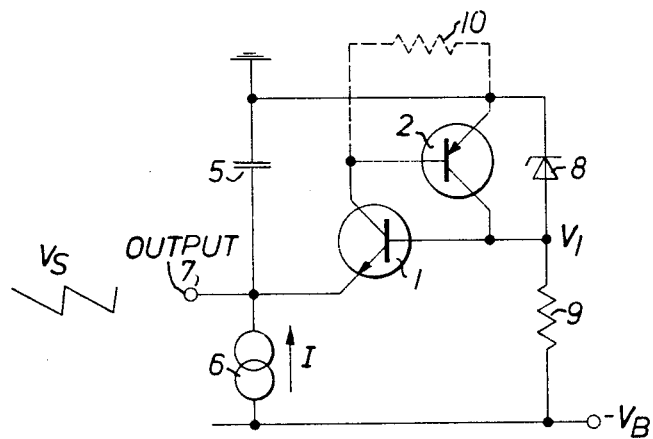
FIG. 1 shows the previously described prior art circuit.
Figure 2:
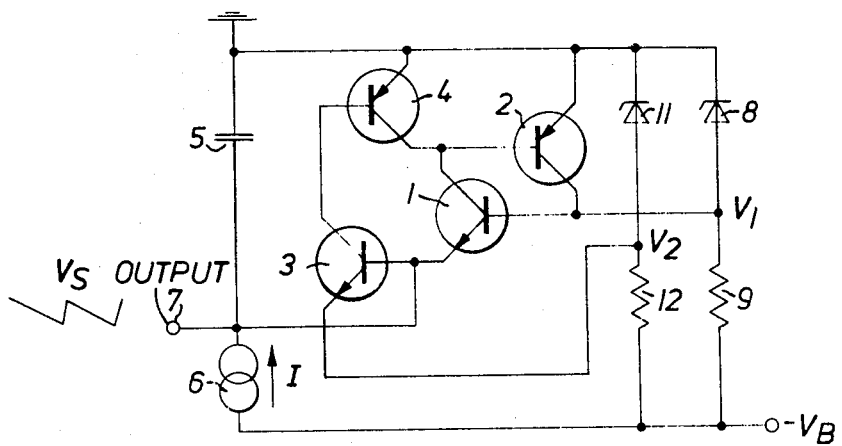
FIG. 2 shows the circuit of FIG. 1 modified according to the present invention.

FIG. 2 shows the circuit according to the present invention which includes, in addition to all of the circuitry described above with respect to FIG. 1, an auxiliary pair of complementary transistors 3,4, a Zener diode 11 and a resistor 12. The Zener diode 11 and the resistor 12 are, as in the embodiment of FIG. 1, connected to form a voltage divider to produce a threshold or reference voltage $V_2$ for the transistor pair 3, 4. The transistor 3 has its base connected to the emitter of transistor 1, its collector connected to the base of transistor 4 and its emitter connected to the output of the voltage divider 11-12 to receive the reference voltage $V_2$. The transistor 4 additionally has its collector connected to the collector of transistor 1 and its emitter connected to ground. In principle transistors 3, 4 are interconnected in the same manner as transistors 1, 2 with the exception that between the collector of transistor 4 and the base of transistor 3 lies the collector-emitter path of transistor 1 which is switched through during discharging.

The voltage value $V_1$ is equal to the maximum amplitude of the sawtooth voltage. The voltage value of $V_2$ is equal to the break-off-value of the sawtooth voltage. The voltage value of $V_1$ is achieved by the voltage divider ratio of the zener diode 11 and the resistance 12.

In operation of the circuit of FIG. 2, transistors 1, 2 initially behave the same as in FIG. 1. However, if voltage $V_S$ drops below the value $V_2$ by $V_{BE3}$, transistors 3, 4 will also switch through, i.e., become conductive. Now for a short period of time the current can flow only through the collector-emitter paths of transistor 1 and transistor 4. Capacitor 5 is thus discharged further than in the known circuit of FIG. 1. After the technically required storage time has expired, transistor 2 blocks because its base has been short-circuited via transistor 4. Transistor 1 then receives no base current and blocks so that transistor 3 and finally also transistor 4 are blocked. The upper limit of the charging current is now given only theoretically, but no longer in principle. With the circuit of FIG. 2, it has been found that the charging current I can be varied at a ratio of more than 1:30,000 to change the frequency of the sawtooth output voltage $V_S$ at terminal 7.

If the frequency shall vary from 2 Hz to 20 kHz the condenser 5, for example, has a capacitance of 100 n F. The resistance 9, for example, has a value of 4.7 KOhm and the resistance 12 a value of 18 KOhm. In this case the voltage $V_1$ amounts to $-8$ V and the voltage $V_2$ amounts to $-2$ V. The current of source 6 varies from 1.2 $\mu$A to 12 mA. ($V_B = -10$ Volt)

It will be understood that the above description of the present invention is susceptible to various modifications, changes and adaptations, and the same are intended to be comprehended within the meaning and range of equivalents of the appended claims.

What is claimed is:

1. In a sawtooth generator comprising a capacitor having one terminal connected to ground and its other terminal connected to the output of a constant current source means for slowly charging said capacitor, and circuit means for rapidly discharging said capacitor including first and second mutually complementary transistors with said first transistor having its emitter connected to said other terminal of said capacitor and responsive to the voltage on the capacitor, its base connected to a first reference voltage and to the collector of said second transistor, and its base connected to the collector of said second transistor, and with said second transistor having its emitter connected to ground; the improvement wherein: said circuit means further includes third and fourth mutually complementary transistors; said third transistor is of the same polarity type as said first transistor and has its base connected to the emitter of said first transistor, its collector connected to the base of said fourth transistor and its emitter connected to a second reference voltage; and said fourth transistor has its collector connected to the collector of said first transistor and its emitter connected to ground, whereby the sawtooth generator has a wide frequency variation range.

2. The sawtooth generator defined in claim 1 further comprising: means for providing said first reference voltage including a first voltage divider which is formed by the series connection of a resistor and a Zener diode, is connected between ground and an input terminal for a source of operating potential, and has its output connected to said base of said first transistor; and means for providing said second reference voltage including a second voltage divider which is formed by the series connection of a further Zener diode and a further resistor, is connected between ground and said input terminal, and has its output connected to said base of said third transistor.

3. The sawtooth generator defined in claim 1 wherein said constant current source charges said capacitor with a negative polarity relative to ground, said first and third transistors are NPN transistors and said second and fourth transistors are PNP transistors.

* * * * *